(12) United States Patent
Scott et al.

(10) Patent No.: US 10,447,222 B2
(45) Date of Patent: Oct. 15, 2019

(54) DYNAMIC THERMAL COMPENSATION IN A POWER AMPLIFIER

(71) Applicant: Qorvo US, Inc., Greensboro, NC (US)

(72) Inventors: Baker Scott, San Jose, CA (US); David Reed, Colorado Springs, CO (US); Christopher T. Brown, Sunnyvale, CA (US); Dirk Robert Walter Leipold, San Jose, CA (US); George Maxim, Saratoga, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/921,843

(22) Filed: Mar. 15, 2018

(65) Prior Publication Data

US 2019/0074806 A1 Mar. 7, 2019

Related U.S. Application Data

(60) Provisional application No. 62/555,153, filed on Sep. 7, 2017.

(51) Int. Cl.
| | |
|---|---|
| *H04L 1/24* | (2006.01) |
| *H03G 3/20* | (2006.01) |
| *H03G 3/00* | (2006.01) |
| *H03F 1/30* | (2006.01) |
| *H03F 1/02* | (2006.01) |
| *H03F 1/32* | (2006.01) |
| *H03F 3/195* | (2006.01) |
| *H03F 3/24* | (2006.01) |

(52) U.S. Cl.
CPC .............. *H03G 3/20* (2013.01); *H03F 1/0266* (2013.01); *H03F 1/30* (2013.01); *H03F 1/3241* (2013.01); *H03F 3/195* (2013.01); *H03F 3/245* (2013.01); *H03G 3/004* (2013.01); *H04L 1/24* (2013.01); *H03F 2200/411* (2013.01); *H03F 2200/447* (2013.01); *H03G 2201/708* (2013.01)

(58) Field of Classification Search
CPC .............................. H04B 1/04; H04B 1/0458; H04B 2001/0416; H03F 1/30; H03F 3/21; H03F 3/19; H03F 3/245; H03F 3/193; H03F 2200/45; H03F 2200/423; H03G 3/0004; H04L 1/24
See application file for complete search history.

(56) References Cited

U.S. PATENT DOCUMENTS

| | | | |
|---|---|---|---|
| 2014/0159817 A1* | 6/2014 | Poulin ....................... | H03F 3/19 330/285 |
| 2015/0180518 A1* | 6/2015 | Whittaker ................. | H04B 1/40 455/127.2 |
| 2018/0115287 A1* | 4/2018 | Rabjohn ................... | H03F 3/195 |
| 2018/0316327 A1* | 11/2018 | Ranta ........................ | H03F 3/21 |

* cited by examiner

*Primary Examiner* — Thanh C Le
(74) *Attorney, Agent, or Firm* — Withrow & Terranova, P.L.L.C.

(57) ABSTRACT

Dynamic error vector magnitude (EVM) compensation is accomplished for radio frequency (RF) power amplifiers (PAs) which experience EVM distortion from thermal settling. Thermal settling causes gain changes in the PAs, and systems, apparatuses, and methods of the present disclosure compensate for known thermal transients of PAs.

20 Claims, 3 Drawing Sheets

DYNAMIC THERMAL COMPENSATION IN A POWER AMPLIFIER

RELATED APPLICATION

This application claims the benefit of provisional patent application Ser. No. 62/555,153, filed Sep. 7, 2017, the disclosure of which is hereby incorporated herein by reference in its entirety.

FIELD OF THE DISCLOSURE

The present disclosure relates to power amplifiers (PAs). More particularly, embodiments of the present disclosure relate to thermal compensation of a radio frequency (RF) PA.

BACKGROUND

As wireless communications technologies evolve, wireless communications systems become increasingly sophisticated. As part of this technical evolution, radio frequency (RF) communications systems have increasing demands for rapid high-frequency communications. At the same time, power consumption of RF communications systems are a concern, particularly where wireless communications systems incorporate handheld devices.

SUMMARY

Power amplifiers (PAs) may experience error vector magnitude (EVM) distortion due to slow thermal settling, which may cause changes to the gain of the PAs. The present disclosure describes systems, apparatuses, and methods to improve PA dynamic EVM performance by compensating for thermal transients of power amplifiers.

In an example embodiment, a radio frequency (RF) circuit includes an RF PA and an amplifier bias circuit. The RF PA is configured to receive and amplify an RF input signal to provide an RF output signal. The amplifier bias circuit is configured to selectively enable and disable the RF PA using an amplifier bias signal and adjust the amplifier bias signal to compensate for a dynamic thermal response of the RF PA when the RF PA transitions from being disabled to being enabled.

In some examples, the amplifier bias circuit is further configured to adjust the amplifier bias signal based on a duration in which the RF PA is enabled, based on a power level of the RF PA, and/or based on a power level of the RF input signal. The amplifier bias circuit may be further configured to adjust the amplifier bias signal to compensate for a dynamic thermal response of a past enable cycle of the RF PA. The amplifier bias circuit may sum a residual thermal compensation from the past enable cycle of the RF PA with a current compensation for the dynamic thermal response of the RF PA.

In some examples, the dynamic thermal response of the RF PA comprises an exponential thermal slewing of the RF output signal. The amplifier bias circuit may be further configured to produce a bias adjustment signal which includes an exponential approximation of the exponential thermal slewing of the RF output signal. The bias adjustment signal is realized using digital circuit components or analog circuit components.

In another example embodiment, a PA system includes a PA comprising a first amplification stage which is cycled between enabled and disabled. An amplifier bias circuit is coupled to the first amplification stage and a dynamic EVM controller is coupled to the amplifier bias circuit. The dynamic EVM controller is configured to supply a first bias adjustment signal, wherein the first bias adjustment signal is configured to compensate for a thermal distortion of the first amplification stage. The first bias adjustment signal is combined with a first bias signal to produce a first bias output signal and the first bias output signal is coupled to a bias input of the first amplification stage.

In some examples, the dynamic EVM controller comprises a lookup table which controls generation of the first bias adjustment signal. The lookup table may control generation of the first bias adjustment signal based on a power level of the first amplification stage. The lookup table may store a characteristic of a past PA enable cycle and control generation of the first bias adjustment signal based on a characteristic of a current PA enable cycle and the characteristic of the past PA enable cycle.

In some examples, the PA further comprises a second amplification stage in series with the first amplification stage. The dynamic EVM controller may be further configured to supply a second bias adjustment signal which compensates for a thermal distortion of the second amplification stage. The second bias adjustment signal may be combined with a second bias signal to produce a second bias output signal and the second bias output signal may be coupled to a bias input of the second amplification stage.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
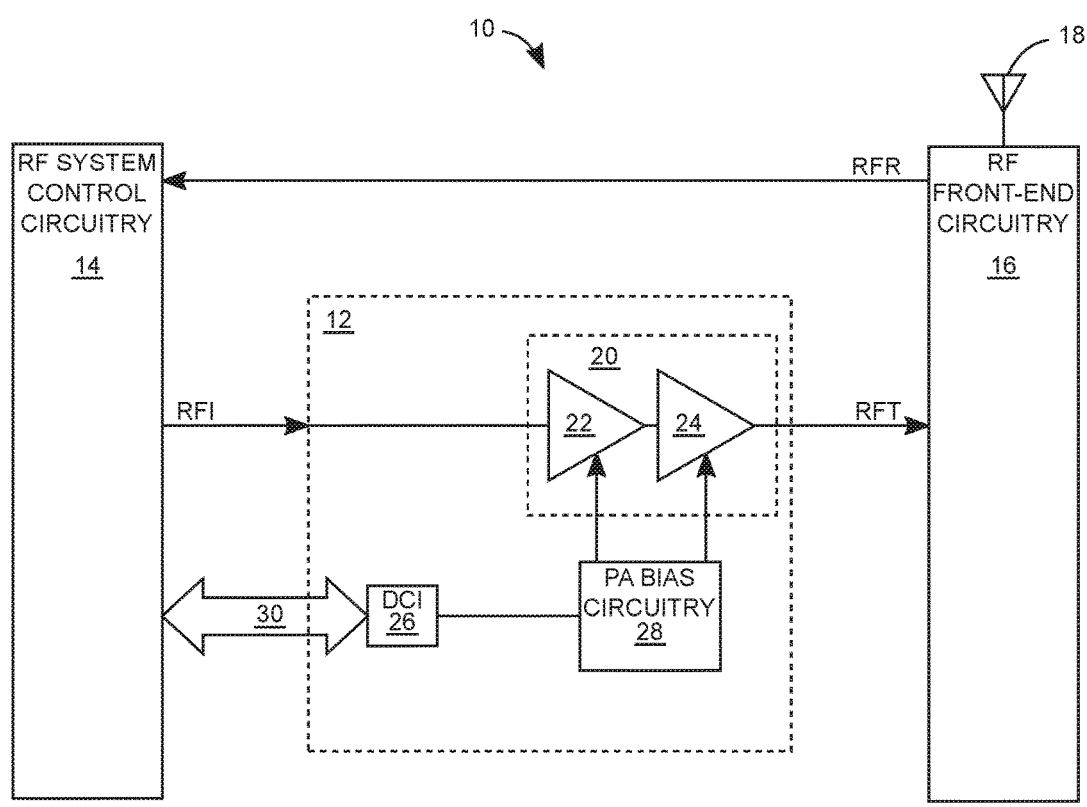
FIG. 1 depicts a diagram of a radio frequency (RF) communications system according to an example embodiment of the RF communications system.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

A power amplifier (PA) reproduces a low power electrical signal at a power level high enough to drive a target component. In a radio frequency (RF) application, for example, a PA may drive an antenna transmission. A solid state RF PA may suffer from a thermal settling time which is long relative to a switching time of the PA and/or a frequency of an RF signal. This long thermal settling time causes the PA to experience a different gain than desired, which results in dynamic error vector magnitude (EVM) distortions, in which a desired signal level is not accurately reproduced at an amplified level. The dynamic EVM distortions are exacerbated in systems in which the PA is frequently switched on and off, such as modern high-frequency mobile communications.

Systems, devices, and methods of the present disclosure incorporate a dynamic EVM controller to compensate for the thermal settling time (e.g., a thermal response) of an RF PA which cycles between being enabled and disabled. Transient thermal distortions of a PA may be predictable, allowing for correction of dynamic EVM distortions in an output of the PA. The dynamic EVM controller compensates for expected EVM distortions by injecting a predistortion compensation signal into a bias of the RF PA. This compensation signal may effectively adjust the gain of the PA according to the predicted transient thermal distortions of the PA. In some examples, the pre-distortion compensation signal may approximate the thermal response of the RF PA.

Traditional approaches to thermal compensation in PAs have focused on attempting to match a temperature of a PA bias circuit with a temperature of a PA. This approach may improve initial gain distortions of a PA, but as power ramps up during a PA enable cycle, the PA bias circuit may not compensate for the dynamic changes in gain due to power dissipation of the PA.

However, the gain changes due to PA ramp up may be predictable, and a dynamic EVM controller according to the present disclosure compensates for these predicted gain changes (e.g., thermal responses). The dynamic EVM controller may be implemented as a digital circuit, an analog circuit, or a mixed circuit. For example, a digital dynamic EVM controller may incorporate a lookup table to generate appropriate bias compensation signals. The compensation signals may be based on various characteristics, such as RF signal average or envelope power, duration of a PA enable cycle, past PA enable cycles, and so on.

PA gain changes may be exponential in nature, such that a compensating bias signal may have one or more exponential components. Thus, a dynamic EVM controller or other circuitry may sum these exponential components with a base bias signal in the digital or analog domain. Accordingly, a summed bias and compensation signal may be used to bias the RF PA and compensate for dynamic EVM distortions.

These and other embodiments are discussed below with reference to FIGS. 1-4. However, those skilled in the art will readily appreciate that the detailed description given herein with respect to these Figures is for explanatory purposes only and should not be construed as limiting.

The present description is generally discussed in terms of a digital implementation of a dynamic EVM controller. It should be understood that a digital implementation is discussed for exemplary purposes, and that the present disclosure is not limited to a digital implementation. The circuits described below may operate with digital, analog, or mixed signals. For example, exponential bias compensation signals may be generated as digital signals and later converted to analog, or may be generated as analog signals directly.

FIG. 1 depicts a diagram of an RF communications system 10 according to an example embodiment of the RF communications system 10. The RF communications system 10 includes RF transmitter circuitry 12, RF system control circuitry 14, RF front-end circuitry 16, and an RF antenna 18. The RF transmitter circuitry 12 includes an RF PA 20, which may include one or more amplification stages 22, 24. The RF transmitter circuitry 12 also includes a digital communications interface (DCI) 26 and PA bias circuitry 28.

In one embodiment of the RF communications system 10, the RF front-end circuitry 16 receives via the RF antenna 18, processes, and forwards an RF receive signal RFR to the RF system control circuitry 14. The RF system control circuitry 14 provides an RF input signal RFI to the RF PA 20. The RF PA 20 receives and amplifies the RF input signal RFI to provide an RF transmit signal RFT. The RF front-end circuitry 16 receives, processes, and transmits the RF transmit signal RFT via the RF antenna 18.

The PA bias circuitry 28 provides a PA bias signal to the one or more amplification stages 22, 24 of the RF PA 20. In one embodiment of the PA bias circuitry 28, the PA bias circuitry 28 biases the RF PA 20 based on signals received from the RF system control circuitry 14. The PA bias circuitry 28 may further selectively enable and disable operation of the RF PA 20, such as to conserve power when the RF transmit signal RFT is not being transmitted. The RF PA 20 may frequently cycle between enablement and disablement (e.g., due to rapid switching between transmission and reception of signals by the RF front-end circuitry 16), and the length of enabled cycles and/or disabled cycles may vary.

When the RF PA 20 transitions from being disabled to being enabled, the gain of the RF PA 20 may be distorted (e.g., altered from a target level) due to changes in temperature as the RF PA 20 begins operating (e.g., conducting current). This distortion, or thermal slewing, of the RF PA gain may result in EVM distortions to the RF transmit signal RFT. The PA bias circuitry 28 may, therefore, include circuitry to compensate for the thermal slewing (e.g., thermal response) of the RF PA 20 and thereby reduce or eliminate the EVM distortions, as discussed further below with respect to FIGS. 2-4.

In some embodiments, the RF transmitter circuitry 12 further includes the DCI 26, which is coupled between the PA bias circuitry 28 and a digital communications bus 30. The digital communications bus 30 is also coupled to the RF system control circuitry 14. As such, the RF system control circuitry 14 provides control signaling to the PA bias circuitry 28 via the digital communications bus 30 and the DCI 26. In other embodiments, the digital communications bus 30 and/or the DCI 26 may be omitted. For example, the RF system control circuitry 14 may directly communicate with the PA bias circuitry 28 and/or the PA bias circuitry 28 may receive analog or mixed control signaling rather than digital signaling.

In some embodiments of the RF front-end circuitry 16, the RF front-end circuitry 16 includes at least one RF switch, at least one RF amplifier, at least one RF filter, at least one RF duplexer, at least one RF diplexer, at least one RF amplifier, the like, or any combination thereof. In one embodiment of the RF system control circuitry 14, the RF system control circuitry 14 is RF transceiver circuitry, which may include an RF transceiver integrated circuit, baseband controller circuitry, the like, or any combination thereof.

Figure 2:
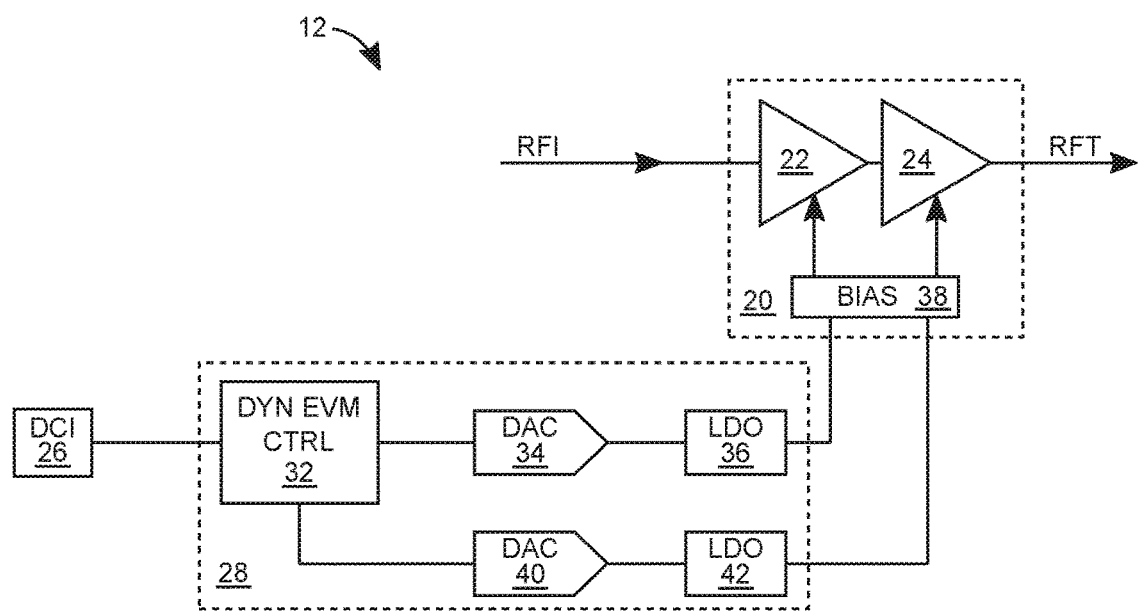
FIG. 2 depicts a diagram of RF transmitter circuitry, which includes a power amplifier (PA) and PA bias circuitry incorporating a dynamic error vector magnitude (EVM) controller.

FIG. 2 depicts a diagram of the RF transmitter circuitry 12, which includes the RF PA 20 and the PA bias circuitry 28 incorporating a dynamic EVM controller 32. The PA bias circuitry 28 provides a PA bias signal to the RF PA 20. The RF system control circuitry 14 (shown in FIG. 1) provides control signaling to the PA bias circuitry 28 via the DCI 26.

The PA bias circuitry 28 includes the dynamic EVM controller 32 to compensate for EVM distortions in the RF transmit signal RFT caused by thermal transients (e.g., thermal response(s)) of the RF PA 20. In the embodiment depicted in FIG. 2, the dynamic EVM controller 32 is a digital circuit, though this is not required. Thus the PA bias circuitry 28 also includes a first digital to analog converter (DAC) 34 between the dynamic EVM controller 32 and the first amplification stage 22 of the RF PA 20. In some embodiments, a first low-dropout regulator (LDO) 36 or other signal conditioning circuitry is coupled between the first DAC 34 and the first amplification stage 22.

When the first amplification stage 22 is enabled after a disabled cycle, EVM distortions in an amplified signal may occur due to thermal slewing (e.g., during a transient thermal settling time) of the signal path. The transient thermal settling time, and the EVM distortions caused thereby, may be predictable based on initial conditions, but those initial conditions may vary between enable cycles of the first amplification stage 22.

Transient EVM distortions in an output of the first amplification stage 22 may be compensated for by adjusting the bias of the first amplification stage 22. Thus, the PA bias circuitry 28 includes the dynamic EVM controller 32 which can adjust the bias of the first amplification stage 22 to correct for transient EVM distortions. Generally, the thermal slewing of the first amplification stage 22 may include an exponential component, and the dynamic EVM controller 32 may accordingly compensate by including an exponential compensation to the bias of the first amplification stage 22. For example, the exponential compensation of the dynamic EVM controller 32 may approximate a thermal response of the first amplification stage 22.

Because the EVM distortion may vary, the dynamic EVM controller 32 may adjust the bias of the first amplification stage 22 based on initial conditions of the first amplification stage 22 (e.g., temperature, operation time) and/or characteristics of the RF input signal RFI (e.g., average or envelope power, duration), as well as past characteristics of the RF input signal RFI.

In order to adjust for changes in the conditions of the first amplification stage 22 and the RF input signal RFI, the dynamic EVM controller 32 may incorporate a lookup table which may set parameters of an EVM compensation component of the bias for the first amplification stage 22. In other embodiments, this may be implemented differently, such as through E-fuse, volatile or non-volatile memory, fabrication trimming, and so on.

In the illustrated embodiment, the dynamic EVM controller 32 generates a digital EVM compensated bias signal for the first amplification stage 22. This digital EVM compensated bias signal is transmitted to the first DAC 34 to generate an analog EVM compensated bias signal. The analog EVM compensated bias signal may then be coupled to a bias input of the first amplification stage 22. In some embodiments, additional circuitry such as the first LDO 36 and/or a bias circuit 38 in the RF PA 20 may condition and/or route the analog EVM compensated bias signal to the bias input of the first amplification stage 22.

In some embodiments, the RF PA 20 includes more than one amplification stage (in series, in parallel, or otherwise), such as the first amplification stage 22 and the second amplification stage 24. In such embodiments, the dynamic EVM controller 32 may output separate signals for each amplification stage 22, 24. Thus the PA bias circuitry 28 may further include a second DAC 40 and/or a second LDO 42 between the dynamic EVM controller 32 and a bias input of the second amplification stage 24. In other embodiments, the RF transmitter circuitry 12 may include a separate dynamic EVM controller 32 for each amplification stage 22, 24.

It should be understood that this diagram of the RF transmitter circuitry 12 is exemplary in nature. In various embodiments, the RF transmitter circuitry 12 may omit certain components or include additional components. In addition, functions of the components illustrated may be separated or combined with other components.

Figure 3:
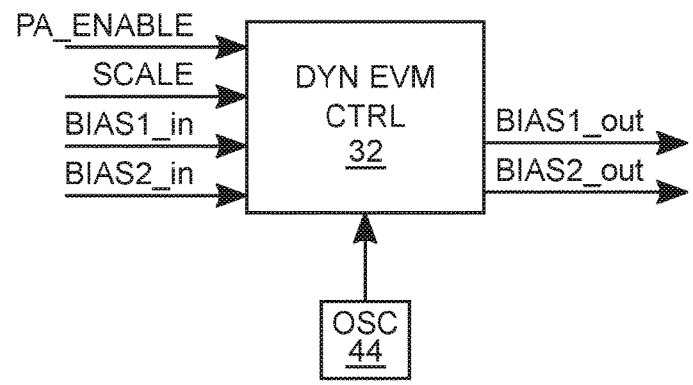
FIG. 3 depicts a block diagram of the dynamic EVM controller, along with input and output signals.
Figure 4:
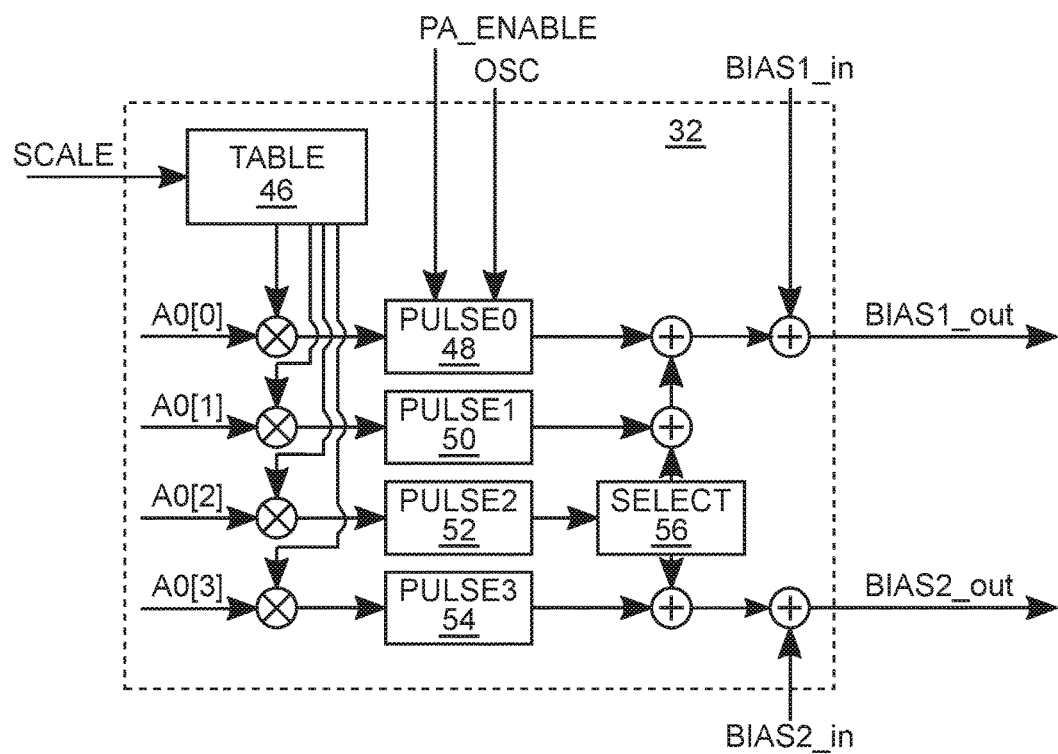
FIG. 4 depicts an example digital implementation of the dynamic EVM controller.

FIGS. 3 and 4 are similarly exemplary embodiments of the dynamic EVM controller 32, illustrating a digital implementation. As previously described, the dynamic EVM controller 32 can instead be implemented as an analog or mixed circuit in other embodiments.

FIG. 3 depicts a block diagram of the dynamic EVM controller 32, along with input and output signals. The dynamic EVM controller 32 is implemented with a dual stage RF PA 20, although in other embodiments the dynamic EVM controller 32 may be implemented with a single- or multi-stage RF PA 20.

The dynamic EVM controller 32 may receive (such as through the DCI 26 shown in FIGS. 1 and 2) an enable signal for the RF PA 20 PA_ENABLE, a scaling signal SCALE, a first bias input signal BIAS1_in, and a second bias input signal BIAS2_in. The dynamic EVM controller 32 may further receive one or more signals from an oscillator 44.

The dynamic EVM controller 32 may further output bias signals for each amplification stage 22, 24 of the RF PA 20, including a first bias output signal for the first amplification stage 22 BIAS1_out and a second bias output signal for the second amplification stage 24 BIAS2_out. The first bias output signal BIAS1_out may provide a digital EVM compensated bias signal, which may be coupled to the first DAC 34 and the first amplification stage 22.

The second bias output signal BIAS2_out may similarly provide a digital EVM compensated bias signal, which may be coupled to the second DAC 40 and the second amplification stage 24 (see FIG. 2). In implementations for single-stage RF PAs 20, the second bias output signal BIAS2_out may be omitted, and in implementations for three- or more-stage RF PAs 20, the dynamic EVM controller 32 may output additional EVM compensated bias signals.

Each of the bias output signals BIAS1_out and BIAS2_out may be generated based on the input signals and signals generated by the oscillator 44. For example, the first bias input signal BIAS1_in may be a baseline bias signal for the first amplification stage 22 of the RF PA 20, and may be generated by another component (such as the RF system control circuitry 14) based on parameters such as a temperature of the RF PA 20 (see FIGS. 1 and 2).

The dynamic EVM controller 32 may adjust the first bias input signal BIAS1_in to produce the first bias output signal BIAS1_out based on inputs such as the PA_ENABLE signal and the SCALE signal. For example, the PA_ENABLE signal may be switched from a low value to a high value to selectively enable the RF PA 20 and the first amplification stage 22. This may also trigger the dynamic EVM controller 32 to generate a compensation signal for the EVM distortions which may be caused by the first amplification stage 22.

The shape, amplitude, and other features of the compensation signal may be based on the SCALE signal. The SCALE signal may, for example, indicate the average or envelope power of an incoming RF input signal RFI. The dynamic EVM controller 32 may look up compensation parameters, including exponential signal components, based on the SCALE signal, and output a BIAS1_out signal based on those compensation parameters.

In some examples, the dynamic EVM controller 32 may use one or more signals generated by the oscillator 44 to generate a compensation signal, which may be summed or otherwise combined with the first bias input signal BIAS1_in, resulting in the first bias output signal BIAS1_out. A similar process may be used for generating the second bias output signal BIAS2_out and any other signals.

Turning in more detail to FIG. 4, the dynamic EVM controller 32 may include a lookup table 46, pulse generators PULSE0-PULSE3 48-54, and mixing and summing circuitry. The pulse generators PULSE0-PULSE3 48-54 may receive one or more oscillator inputs OSC, and may be enabled by the PA_ENABLE signal. The lookup table 46 may be used to generate compensation signals by controlling selection of the pulse generators PULSE0-PULSE3 48-54 and input functions A0[0]-A0[3].

Outputs of the pulse generators PULSE0-PULSE3 48-54 may be summed together (including through a select switch 56) to generate digital compensation signals for each of BIAS1_out and BIAS2_out. These compensation signals are then summed together with the BIAS1_in and BIAS2_in signals, respectively. Thus BIAS1_out includes the first bias input signal BIAS1_in, as well as EVM compensation adjustments derived from the lookup table 46. Similarly, BIAS2_out includes the second bias input signal BIAS2_in, as well as EVM compensation adjustments derived from the lookup table 46.

Because the thermal slewing of the RF PA 20 may be exponential, the pulse generators PULSE0-PULSE3 48-54 may generate multiple exponential signals. The lookup table 46 may control the amplitude, polarity, time constant, and so on of each pulse generator PULSE0-PULSE3 48-54. The dynamic EVM controller 32 may further sum the outputs of the pulse generators PULSE0-PULSE3 48-54 together to generate an appropriate compensation to the bias output signals BIAS1_out and BIAS2_out.

The lookup table 46 may store signal adjustment parameters for various scenarios, including different SCALE signals. In some embodiments, the lookup table 46 may further base signal adjustment parameters on one or more previous enable cycles, including the past bias level, duration, and the duration in which the RF PA 20 was disabled.

The dynamic EVM controller 32 may therefore compensate for EVM distortions under various conditions. For example, a first RF PA 20 enable cycle may be long enough for thermal settling. Until the RF PA 20 settles, the dynamic EVM controller 32 may adjust the bias output signals BIAS1_out and BIAS2_out. During a second enable cycle which follows shortly thereafter, the dynamic EVM controller 32 may not adjust the bias output signals, or may only adjust them slightly.

In another example, the first RF PA 20 enable cycle may not be long enough for thermal settling. During a second enable cycle, the dynamic EVM controller 32 may need to generate a distinct compensation signal, which accounts for the compensation level of the first enable cycle and/or the elapsed time while the RF PA 20 was disabled. In some examples, the dynamic EVM controller 32 may sum a past residual thermal compensation (e.g., the remaining compensation signal from the first enable cycle) with a current thermal compensation signal. In some examples, the past residual thermal compensation may be inverted such that summing the signals together subtracts the residual thermal compensation from the first enable cycle from a current thermal compensation for the second enable cycle.

FIGS. 3 and 4 are illustrated as having distinct bias input and output signals for each amplification stage 22, 24 of the RF PA 20. In other embodiments, multiple bias output signals may be generated based on a single input signal (e.g., where a nominal bias of output stages match, but the EVM distortions of each vary), or multiple bias input signals may be used to generate a single output signal (e.g., using a same compensated bias output signal for multiple amplification stages or a digital signal which is multlipexed and later demultiplexed).

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) circuit comprising:
an RF power amplifier (PA) configured to receive and amplify an RF input signal to provide an RF output signal;
an amplifier bias circuit configured to selectively enable and disable the RF PA using an amplifier bias signal; and
a dynamic error vector magnitude (EVM) controller coupled to the amplifier bias circuit and configured to adjust the amplifier bias signal to compensate for a dynamic thermal response of the RF PA during a settling time when the RF PA transitions from being disabled to being enabled.

2. The RF circuit of claim 1, wherein the dynamic EVM controller is further configured to adjust the amplifier bias signal based on a duration in which the RF PA is enabled.

3. The RF circuit of claim 1, wherein the dynamic EVM controller is further configured to adjust the amplifier bias signal based on a power level of the RF PA.

4. The RF circuit of claim 1, wherein the dynamic EVM controller is further configured to adjust the amplifier bias signal based on a power level of the RF input signal.

5. The RF circuit of claim 1, wherein the dynamic EVM controller is further configured to adjust the amplifier bias signal to compensate for a dynamic thermal response of a past enable cycle of the RF PA.

6. The RF circuit of claim 5, wherein the dynamic EVM controller sums a residual thermal compensation from the past enable cycle of the RF PA with a current compensation for the dynamic thermal response of the RF PA.

7. The RF circuit of claim 1, wherein:
the dynamic EVM controller comprises a lookup table which adjusts the amplifier bias signal for an exponential thermal slewing of the RF output signal during the settling time.

8. The RF circuit of claim 7, wherein the dynamic EVM controller is further configured to produce a bias adjustment signal which is combined with the amplifier bias signal and includes an exponential approximation of the exponential thermal slewing of the RF output signal.

9. The RF circuit of claim 8, wherein the bias adjustment signal is realized using digital circuit components.

10. The RF circuit of claim 8, wherein the bias adjustment signal is realized using analog circuit components.

11. The RF circuit of claim 8, wherein the bias adjustment signal combines two or more exponential component signals.

12. A power amplifier (PA) system, comprising:
a PA comprising a first amplification stage and configured to be cycled between enabled and disabled;
an amplifier bias circuit coupled to the first amplification stage; and
a dynamic error vector magnitude (EVM) controller coupled to the amplifier bias circuit and configured to supply a first bias adjustment signal;
wherein:
the first bias adjustment signal is combined with a first bias signal to produce a first bias output signal;
the first bias output signal is coupled to a bias input of the first amplification stage; and
the first bias adjustment signal is configured to compensate for a thermal distortion of the first amplification stage.

13. The PA system of claim 12, wherein:
the dynamic EVM controller comprises a lookup table; and
the lookup table controls generation of the first bias adjustment signal.

14. The PA system of claim 13, wherein the lookup table controls generation of the first bias adjustment signal based on a power level of the first amplification stage.

15. The PA system of claim 13, wherein:
the lookup table stores a characteristic of a past PA enable cycle; and
the lookup table controls generation of the first bias adjustment signal based on a characteristic of a current PA enable cycle and the characteristic of the past PA enable cycle.

16. The PA system of claim 12, wherein the dynamic EVM controller produces the first bias output signal by summing a past bias adjustment signal and the first bias adjustment signal.

17. The PA system of claim 12, wherein the PA further comprises a second amplification stage in series with the first amplification stage.

18. The PA system of claim 17, wherein:
the dynamic EVM controller is further configured to supply a second bias adjustment signal;
the second bias adjustment signal is combined with a second bias signal to produce a second bias output signal;
the second bias output signal is coupled to a bias input of the second amplification stage; and
the second bias adjustment signal is configured to compensate for a thermal distortion of the second amplification stage.

19. The PA system of claim 18, wherein the first bias adjustment signal is based on distinct characteristics from the second bias adjustment signal.

20. The PA system of claim 12, wherein the first bias adjustment signal is combined with the first bias signal in an analog circuit.

* * * * *